United States Patent

Zabler et al.

[11] Patent Number: 5,969,432
[45] Date of Patent: Oct. 19, 1999

[54] ARRANGEMENT FOR CONTROLLING A LOAD CONNECTED TO THE SECONDARY SIDE OF A TRANSFORMER

[75] Inventors: Erich Zabler, Stutensee; Anton Dukart, Wörth, both of Germany

[73] Assignee: Robert Bosch GmbH, Stuttgart, Germany

[21] Appl. No.: 09/051,901

[22] PCT Filed: Jul. 17, 1996

[86] PCT No.: PCT/DE96/01297

§ 371 Date: Jun. 23, 1998

§ 102(e) Date: Jun. 23, 1998

[87] PCT Pub. No.: WO97/15834

PCT Pub. Date: May 1, 1997

[30] Foreign Application Priority Data

Oct. 20, 1995 [DE] Germany .................... 195 39 064

[51] Int. Cl.$^6$ .................................................. B60R 21/32
[52] U.S. Cl. ................. 307/10.1; 180/282; 180/280; 180/735; 180/307; 180/104
[58] Field of Search ................... 307/9.1, 10.1, 307/121, 104; 701/45–47; 280/727, 734, 735; 180/271–274, 282; 336/DIG. 2, 204, 438; 340/310.01, 310.07; 439/950; 455/41; 324/503, 511, 520–523, 525–527

[56] References Cited

U.S. PATENT DOCUMENTS 5,459,449  10/1995  Ravas, Jr. et al. .................... 280/735
5,515,399  5/1996  Swart ...................................... 455/41
5,541,523  7/1996  Tourville et al. ...................... 280/735
5,659,474  8/1997  Maeno et al. ......................... 307/10.1
5,856,710  1/1999  Baughman et al. ................... 307/10.1
5,872,460  2/1999  Bennett et al. ....................... 280/735

FOREIGN PATENT DOCUMENTS 38 12 633  10/1989  Germany .

OTHER PUBLICATIONS

U. Tietze et al., "Halbleiter–Schaltungstechnik", 10$^{th}$ edition, 1993, Springer–Verlag, pp. 880–885. Described in the specification of the above–identified application.

Primary Examiner—Richard T. Elms
Attorney, Agent, or Firm—Kenyon & Kenyon

[57] ABSTRACT

A synchronous rectifier, to which the primary-side input voltage of the transformer and a control voltage with the same frequency as the input voltage is applied, is connected to the primary side of the transformer. The phase of the control voltage can be switched between 0° and 90°, so that the output voltage of the synchronous rectifier corresponds exclusively to the voltage drop component at the ohmic input resistance of the transformer at 0°, and exclusively to the voltage drop component at the inductive input resistance of the transformer at 90°. Since both the ohmic and the inductive input resistances are dependent on the resistance of the load connected to the secondary side (e.g., the squib of an air bag), both voltage components can be used to obtain reliable information on the status of the load resistance.

3 Claims, 1 Drawing Sheet

ARRANGEMENT FOR CONTROLLING A LOAD CONNECTED TO THE SECONDARY SIDE OF A TRANSFORMER

FIELD OF THE INVENTION

The present invention relates to an arrangement for controlling a load connected to the secondary side of a transformer, preferably the squib (firing pellet) of an air bag, using the primary-side input voltage of the transformer.

BACKGROUND INFORMATION

A conventional arrangement is described in German Patent Application No. 38 12 633. In this conventional arrangement, a rotary transformer is used, for example, for signal transmission between a controller and an air bag built into the steering wheel of a motor vehicle. The operability of an air bag must be constantly monitored, so that it is ready to be used immediately in an emergency situation. For this purpose, the resistance of the squib, which should be typically between 1.8 ohm to 2.5 ohm, must be periodically measured. Signal transmission between the inductively coupled windings of the rotary transformer depends on the spacing between the two windings, i.e., the size of the air gap between the pot-type cores of the windings. Installation and manufacturing tolerances of the steering wheel, on which the secondary pot-type core of the rotary transformer is installed, can result in distortions in the measured resistance value of the squib, as can the operating temperature. In order to avoid such distortions, the above-described conventional arrangement provides an oscillator circuit on the secondary side of the rotary transformer, which is excited by a control signal from the primary side. After the control signal is switched off, the decay of the response signal of the oscillator circuit is transmitted back to the primary side and the secondary-side resistance is determined from the time constant of the decaying response signal.

The object of the present invention is to provide a device allowing reliable information to be derived from the primary-side input voltage of the transformer concerning the status (resistance) of the load connected to the secondary side.

SUMMARY OF THE INVENTION

This object is achieved by connecting a synchronous rectifier to the primary side of the transformer. The primary-side input voltage of the transformer and a control voltage with the same frequency as the input voltage is applied to the synchronous rectifier, and the control voltage phase is switched between 0° and 90°. At the 0° phase the output voltage of the synchronous rectifier corresponds exclusively to the voltage drop component at the ohmic input resistance of the transformer, and at the 90° phase the output voltage corresponds exclusively to the voltage drop component at the inductive input resistance of the transformer. Since the ohmic and inductive input resistances vary as different functions of the resistance of the load connected to the secondary side, the arrangement according to the present invention always allows the voltage component providing reliable information on the status of the load connected to the secondary side to be evaluated. Information on the load connected to the secondary side can also be derived from a comparison between the two voltage components.

DETAILED DESCRIPTION OF THE INVENTION

Figure 1:
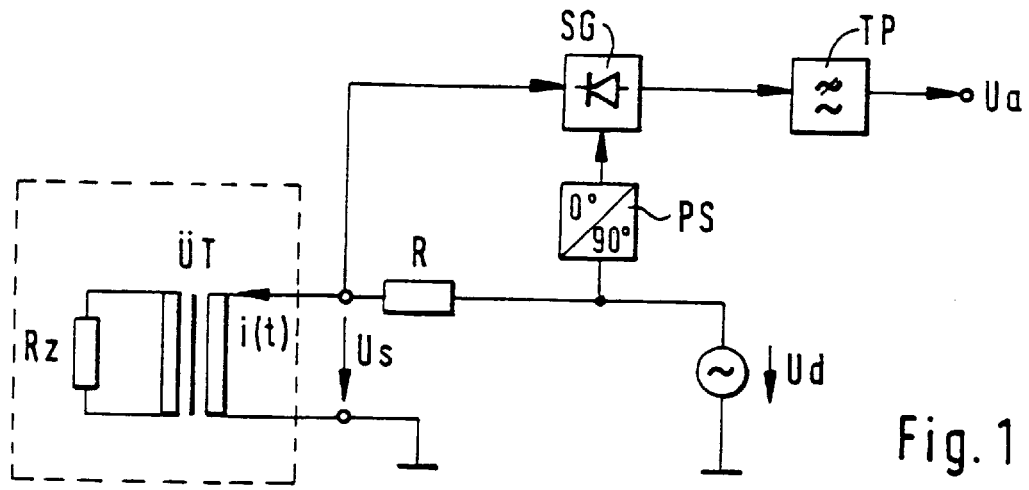
FIG. 1 shows a circuit according to the present invention for determining either an ohmic voltage component or an inductive voltage component on a primary side of a transformer.
Figure 2:
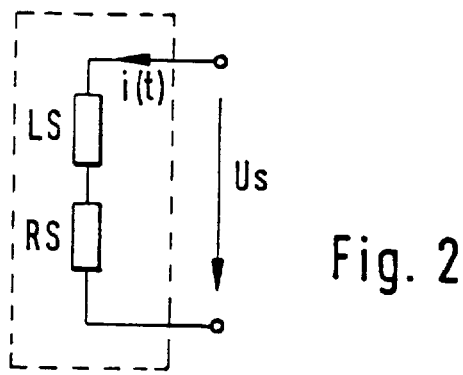
FIG. 2 shows an equivalent circuit of the transformer connected to a load.
Figure 3:
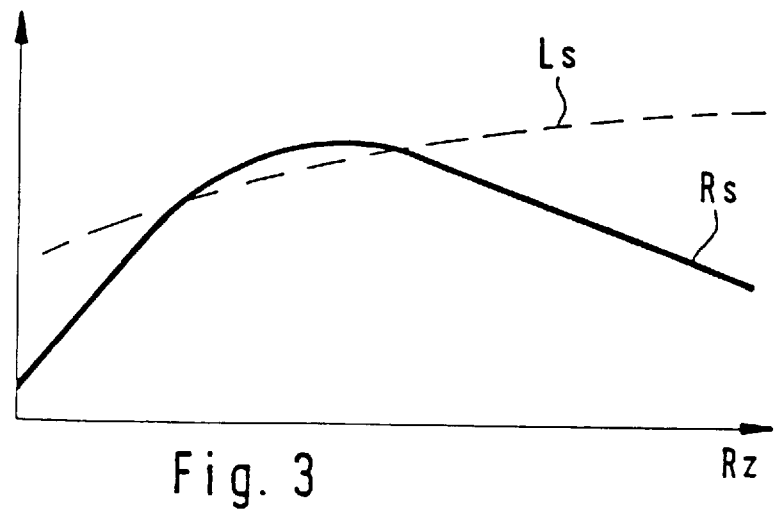
FIG. 3 shows a primary-side ohmic resistance and a primary-side inductive resistance as qualitative functions of a load resistance connected to the secondary side.

A load resistance connected to the secondary side of a transformer is monitored for changes from the primary side. FIG. 1 shows the diagram of a transformer ÜT and a load resistance Rz connected to its secondary side. Transformer ÜT may be a rotary transformer, for example, arranged between a steering wheel equipped with an air bag and the stationary steering column. Load Rz connected to the secondary side then corresponds to the resistance of an air bag squib. Such a squib typically has a resistance Rz of approximately 2 ohm. If the resistance of the squib changes beyond certain limit values, this indicates that the function of the air bag is impaired. Such a situation must be signaled in the motor vehicle. Transformer ÜT with load resistance Rz connected to the secondary side has, seen from its primary side, the secondary circuit illustrated in FIG. 2, including resistance Rs and inductance Ls connected in series. Both resistance Rs and inductance Ls are functions of load resistance Rz connected to the secondary side of transformer ÜT. A graph of relative resistance Rs and of relative inductance Ls is schematically illustrated in FIG. 3. It can be seen that the primary-side inductive input resistance ωLs of the transformer ÜT has a weaker dependence on load resistance Rz than the ohmic input resistance Rs. On the other hand, the dependence of ohmic resistance Rs on load resistance Rz is not unambiguous in all regions, contrary to inductive input resistance ωLs of the transformer ÜT.

The circuit arrangement illustrated in FIG. 1 makes it possible to derive an output voltage Ua from primary-side input voltage Us of transformer ÜT, whose output voltage is proportional either to inductive input resistance Ls or ohmic input resistance Rs of transformer ÜT. Currents can also be evaluated instead of voltages.

A sinusoidal a.c. voltage Ud with frequency $f_0$ (50–100 KHz) is applied to the primary-side input of transformer ÜT. A current $$i(t) = \hat{i} \sin \omega_0 t \qquad (1)$$

is injected at the primary side of the transformer ÜT through a series resistance R, which is substantially greater than the input impedance of transformer ÜT. With the current from equation (1), the input voltage Us of the transformer can be described as follows:

$$Us = Rs\,\hat{i}\,\sin\omega_0 t + \omega_0 Ls\,\hat{i}\,\sin(\omega_0 t + 90°) \qquad (2)$$

This input voltage Us is picked up through a synchronous rectifier SG. Synchronous rectifier SG receives a.c. voltage Ud as a control voltage. Since both the control voltage and the input voltage Us have the same frequency, the rectified input voltage Us will be available at the output of synchronous rectifier SG. A detailed description of the function of a synchronous rectifier, is provided in. U. Tietze, Ch. Schenk, "Halbleiter-Schaltungstechnik"(Semiconductor Circuit Technology) $10^{th}$ edition, 1993, Springer-Verlag, pp. 880–885, which describes a synchronous rectifier, in particular one operating as a phase-sensitive rectifier. Such a phase-sensitive rectifier only rectifies an input voltage whose phase coincides with that of the control voltage. This feature is used in the present circuit arrangement. A.c. voltage Ud is provided to the control input of synchronous rectifier SG via phase switch PS, which can switch between phase states 0° and 90°. As equation (2) shows, input voltage Us is composed of a voltage drop component at ohmic input resistance Rs and a voltage drop component at inductive input resistance $\omega_0 Ls$. If phase switch PS is in the 0° phase state, the control voltage of synchronous rectifier SG is in phase with the voltage component of input voltage Us dropping at ohmic input resistance Rs. Output voltage Ua is then a pure function of ohmic input resistance Rs:

$$Ua \sim \hat{i} Rs \quad (3)$$

If phase switch PS switches over to the 90° phase, the control voltage will be in phase with the voltage component of input voltage Us dropping at inductive input resistance Ls. In this case, output voltage Ua of synchronous rectifier SG is proportional to inductive input resistance $\omega_0 Ls$:

$$Ua \sim \hat{i} \omega_0 Ls \quad (94)$$

A low-pass filter TP connected downstream from synchronous rectifier SG filters out the undesirable a.c. voltage components from the output signal of synchronous rectifier SG.

Thus, with the above circuit, two different output signals Ua can be obtained, which depend on load resistance Rz connected to the secondary side in different manners. By switching phase switch PS in a first state a controller for the air bag can switch over to the output signal Ua, which provides more reliable information on the load resistance (squib). Thus output signal Ua, which is proportional to the ohmic resistance Rs of transformer ÛT, has the advantage of having a greater measuring sensitivity to the load resistance, and it can clearly signal if the secondary side of the transformer is missing, e.g., if the steering wheel containing the air bag has been removed from the vehicle. In a second state output signal Ua, which is proportional exclusively to the inductive input resistance $\omega_0 Ls$ of transformer ÛT, does not clearly indicate when the secondary circuit of the transformer is missing, and has the disadvantage of a low sensitivity to load resistance Rz. Output signal Ua has, however, the advantage that it is unambiguously linked to load resistance Rz. By evaluating both states of the output signal Ua, reliable and accurate information can always be obtained on the status of load resistance Rz.

What is claimed is:

1. An arrangement for monitoring a load having a load resistance, comprising:

a transformer including a primary side and a secondary side and having an ohmic input resistance and an inductive input resistance, the transformer providing an input voltage at the primary side to monitor the load coupled to the secondary side of the transformer; and a synchronous rectifier coupled to the primary side of the transformer and generating an output voltage, the synchronous rectifier receiving the input voltage having a first frequency and a control voltage having a second frequency, the first frequency being equal to the second frequency, the control voltage having a phase switchable between 0° and 90°, wherein, when the phase is 0°, the output voltage of the synchronous rectifier corresponds exclusively to a first voltage drop component at the ohmic input resistance of the transformer, when the phase is 90°, the output voltage of the synchronous rectifier corresponds exclusively to a second voltage drop component at the inductive input resistance of the transformer, and the ohmic and inductive input resistances are dependent on the load resistance of the load.

2. The arrangement according to claim 1, wherein the load includes a squib of an air bag.

3. The arrangement according to claim 1, wherein the ohmic and inductive input resistances are provided on the primary side of the transformer.

* * * * *